(12) United States Patent
Goto et al.

(10) Patent No.: US 7,763,525 B2
(45) Date of Patent: Jul. 27, 2010

(54) METHOD FOR POSITIONING DICING LINE OF WAFER

(75) Inventors: Keisuke Goto, Obu (JP); Kenichi Yokoyama, Nagoya (JP)

(73) Assignee: Denso Corporation, Kariya (JP)

( * ) Notice: Subject to any disclaimer, the term of this patent is extended or adjusted under 35 U.S.C. 154(b) by 1243 days.

(21) Appl. No.: 11/169,579

(22) Filed: Jun. 30, 2005

(65) Prior Publication Data

US 2006/0024920 A1 Feb. 2, 2006

(30) Foreign Application Priority Data

Jul. 29, 2004 (JP) .............................. 2004-222433

(51) Int. Cl.
H01L 21/00 (2006.01)
H01L 21/30 (2006.01)
(52) U.S. Cl. ..................... 438/460; 438/113; 438/461; 438/463; 382/151
(58) Field of Classification Search ................. 438/460, 438/461, 113, 114, 462, 463, 464, 465; 156/60, 156/64; 382/145, 151, 140, 147, 149; 356/399, 356/400, 401, 614, 620
See application file for complete search history.

(56) References Cited

U.S. PATENT DOCUMENTS

| | | | |
|---|---|---|---|
| 4,213,117 A * | 7/1980 | Kembo et al. ............... 382/145 |
| 5,477,218 A | 12/1995 | Manmoto et al. |
| 5,824,177 A | 10/1998 | Yoshihara et al. |
| 5,862,248 A * | 1/1999 | Salatino et al. ............. 382/124 |
| 6,019,663 A * | 2/2000 | Angell et al. ................... 451/5 |
| 6,180,435 B1 * | 1/2001 | Ise et al. ...................... 438/113 |
| 6,245,593 B1 * | 6/2001 | Yoshihara et al. ........... 438/106 |
| 6,487,307 B1 * | 11/2002 | Hennessey et al. .......... 382/149 |
| 6,787,929 B2 * | 9/2004 | Yoshihara et al. ........... 257/792 |

FOREIGN PATENT DOCUMENTS

| JP | A-H06-196556 | 7/1994 |
|---|---|---|
| JP | A-H06-224293 | 8/1994 |
| JP | A-H06-232255 | 8/1994 |
| JP | A-H07-169720 | 7/1995 |
| JP | A-H07-211672 | 8/1995 |
| JP | A-H11-192292 | 7/1999 |

* cited by examiner

Primary Examiner—Geoffrey S. Evans
Assistant Examiner—Ayub Maye
(74) Attorney, Agent, or Firm—Posz Law Group, PLC

(57) ABSTRACT

A method for positioning a dicing line includes the steps of: bonding an adhesive tape on a semiconductor layer of a wafer; detecting an image of the wafer by an imaging device on the basis of a light transmitted through the wafer; and determining the dicing line of the wafer on the basis of a position of an image of a marker, which is disposed on the semiconductor layer of the wafer. The image of the marker is obtained by image recognition from the detected image of the wafer.

10 Claims, 9 Drawing Sheets

FIG. 8
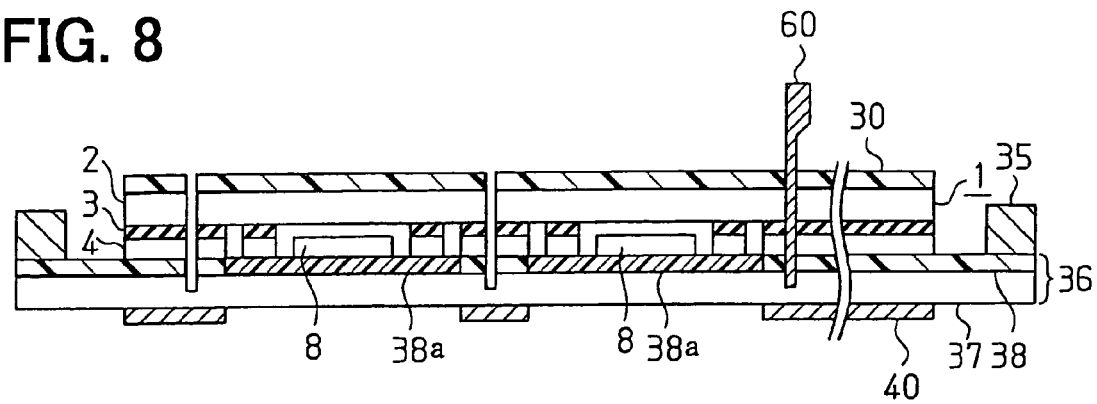
FIG. 9A
PRIOR ART
FIG. 9B
PRIOR ART
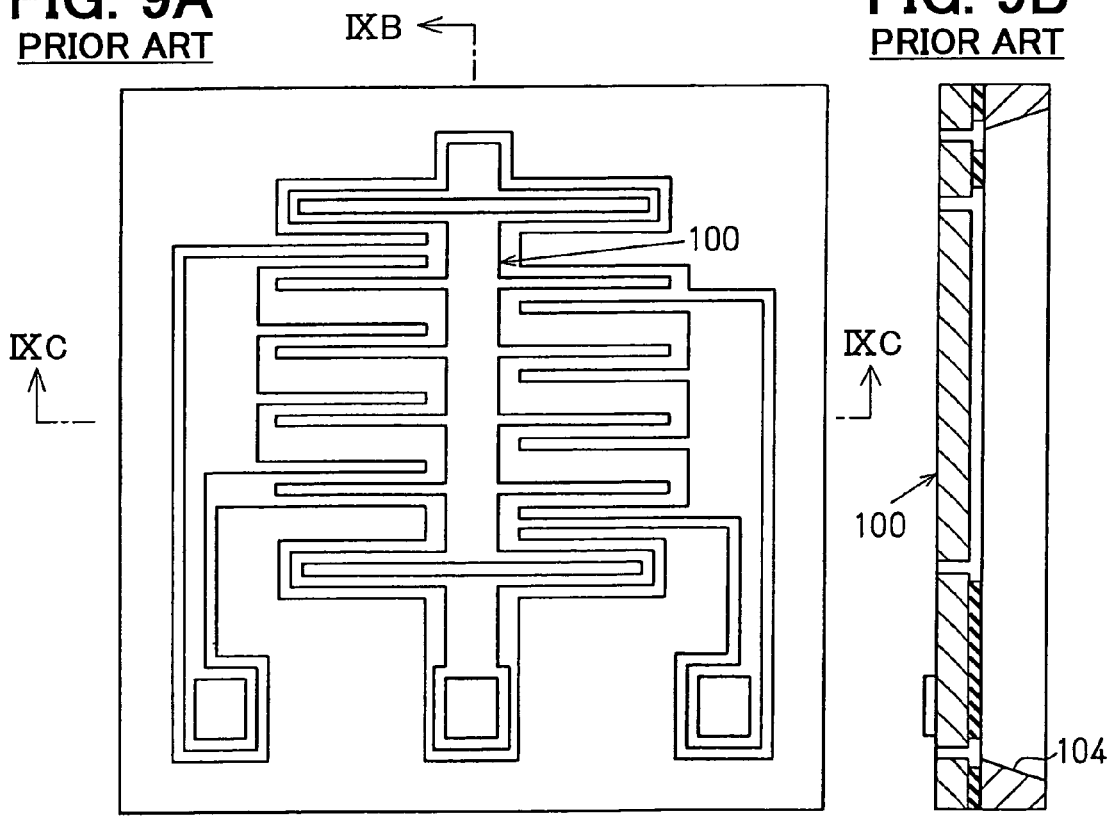
FIG. 9C
PRIOR ART
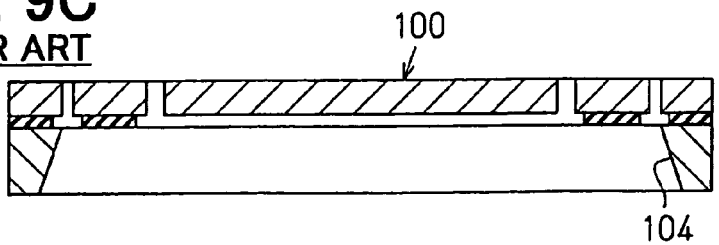

FIG. 12A
PRIOR ART
FIG. 12B
PRIOR ART
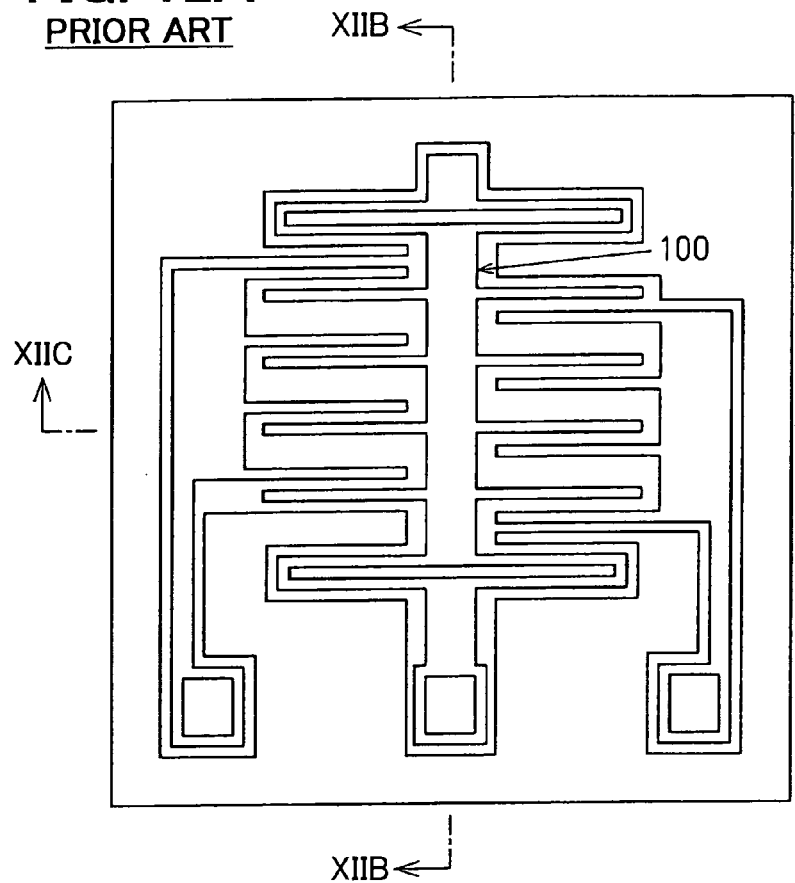
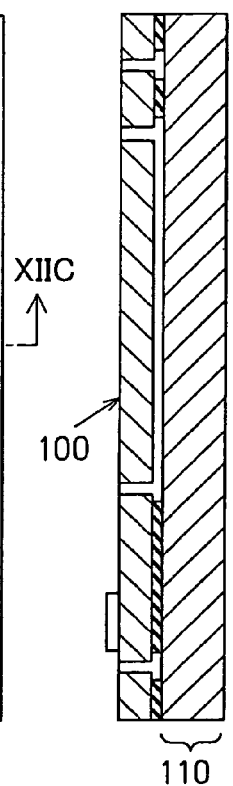
FIG. 12C
PRIOR ART
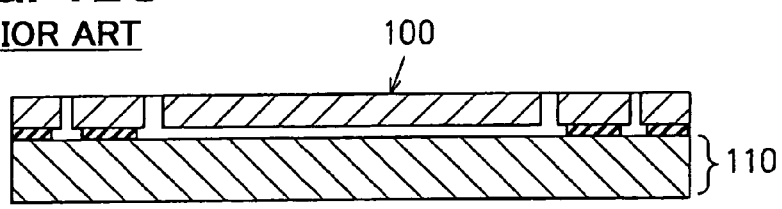

METHOD FOR POSITIONING DICING LINE OF WAFER

CROSS REFERENCE TO RELATED APPLICATION

This application is based on Japanese Patent Application No. 2004-222433 filed on Jul. 29, 2004, the disclosure of which is incorporated herein by reference.

FIELD OF THE INVENTION

The present invention relates to a method for positioning a dicing line of a wafer.

BACKGROUND OF THE INVENTION

When a semiconductor wafer is cut into multiple chips by a dicing cut method, the position of the wafer is aligned by using an alignment marker (i.e., a scribe marker). Specifically, the wafer is positioned in such a manner that the alignment marker on the scriber is aligned from the surface of the wafer. Thus, the wafer is cut into multiple chips. However, as shown in FIGS. 9A to 9C, when a plurality of physical quantity sensors having a beam structure 100 as a movable portion are formed on the surface of the wafer, it is necessary to protect the beam structure 100 during the wafer dicing. Specifically, the beam structure 100 is protected by applying an adhesive tape 101 on the surface of the wafer. Then, the wafer is cut from a backside of the wafer, which is opposite to the beam structure 100. This dicing method is disclosed in Japanese Patent Application Publication No. 2000-223446. At this time, as shown in FIG. 10, a light source 102 for emitting a light having a wavelength capable of transmitting the silicon wafer is disposed on the foreside of the wafer. The light is transmitted through the wafer. Then, the light is detected by an imaging device 103. The imaging device 103 is disposed on the backside of the wafer. As shown in FIG. 11, an outline of the beam structure 100 is aligned with a dicing line so that the wafer is positioned. Specifically, the positioning of the wafer is performed by using the edge of the beam structure 100, and then, the wafer is cut along with the dicing line.

When the beam structure 100 is formed from a concavity 104 having an opening for opening to the backside of the wafer, the beam structure 100 can be projected by the light transmitting through the silicon wafer. Thus, the image of the beam structure 100 is clear and obvious so that the accuracy of positioning of the wafer is high even when the backside of the wafer is rough.

However, as shown in FIG. 12, when the wafer includes a support substrate 110, which is disposed under the beam structure 100, the light transmits the support substrate 110. Therefore, the light may be scattered at the backside of the wafer. Thus, it is difficult to align the wafer. This is because it is difficult to observe the outline of the beam structure 100 clearly and accurately. Thus, the accuracy of the positioning method of the wafer is reduced.

SUMMARY OF THE INVENTION

In view of the above-described problem, it is an object of the present invention to provide a method for positioning a dicing line with high accuracy.

A method for positioning a dicing line of a semiconductor wafer having multiple semiconductor devices disposed on the wafer, wherein the wafer includes a support substrate, an embedded insulation layer and a semiconductor layer, which are stacked in this order, and wherein each semiconductor device includes a movable portion formed in the semiconductor layer of the wafer, the method includes the steps of: bonding an adhesive tape on the semiconductor layer of the wafer; detecting an image of the wafer by an imaging device on the basis of a light transmitted through the wafer, wherein the light is emitted from a light source disposed on a semiconductor layer side of the wafer, and wherein the imaging device is disposed on a support substrate side of the wafer; and determining the dicing line of the wafer on the basis of a position of an image of a marker, which is disposed on the semiconductor layer of the wafer, wherein the image of the marker is obtained by image recognition from the detected image of the wafer.

The above method provides to determine the dicing line of the wafer accurately so that the wafer is cut into chips precisely.

Preferably, the marker is a plurality of bonding pads on the wafer. The step of determining the dicing line includes the steps of: processing the image of the wafer by a computer; recognizing the processed image of the wafer so that a center position of each bonding pad is defined; and determining the dicing line on the basis of a plurality of center positions of the bonding pads. More preferably, the dicing line is determined in such a manner that two axes orthogonal coordinate system is defined on the image of the wafer by using the center positions of the bonding pads.

BRIEF DESCRIPTION OF THE DRAWINGS

The above and other objects, features and advantages of the present invention will become more apparent from the following detailed description made with reference to the accompanying drawings. In the drawings:

FIG. 8 is a cross sectional view explaining the dicing process, according to the preferred embodiment;

FIG. 9A is a plan view showing a sensor formed by a positioning method according to a prior art, FIG. 9B is a cross sectional view showing the sensor taken along line IXB-IXB in FIG. 9A, and FIG. 9C is a cross sectional view showing the sensor taken along line IXC-IXC in FIG. 9A;

FIG. 12A is a plan view showing a physical quantity sensor formed by the positioning method according to the prior art, FIG. 12B is a cross sectional view showing the sensor taken along line XIIB-XIIB in FIG. 12A, and FIG. 12C is a cross sectional view showing the sensor taken along line XIIC-XIIC in FIG. 12A.

DETAILED DESCRIPTION OF THE PREFERRED EMBODIMENT

Figure 1:
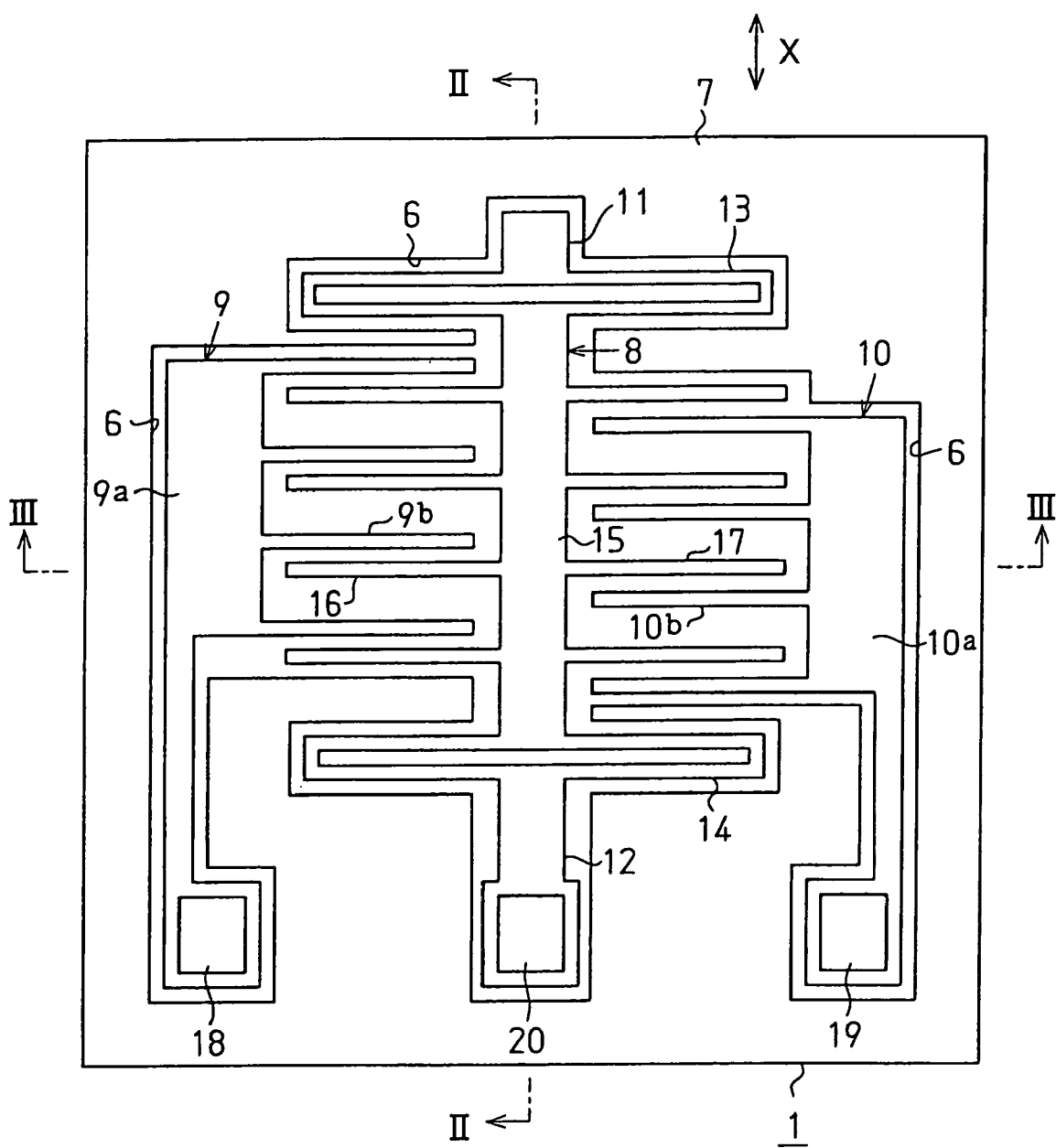
FIG. 1 is a plan view showing a semiconductor acceleration sensor formed by a positioning method according to a preferred embodiment of the present invention.
Figure 2:
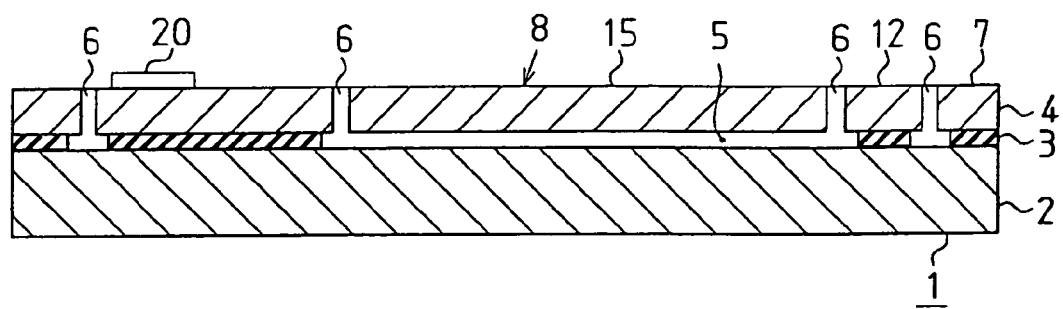
FIG. 2 is a cross sectional view showing the sensor taken along line II-II in FIG. 1.
Figure 3:
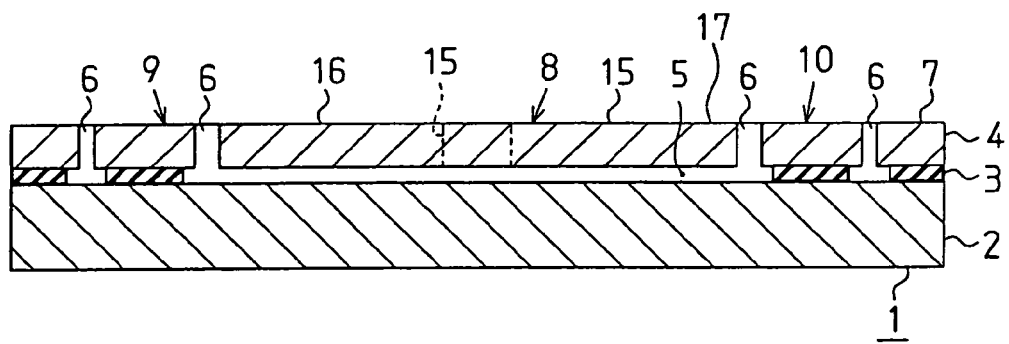
FIG. 3 is a cross sectional view showing the sensor taken along line III-III in FIG. 1.

A method for positioning a dicing line according to a preferred embodiment of the present invention is described as follows. FIGS. 1 to 3 show a semiconductor acceleration sensor. The sensor includes a SOI (i.e., silicon on insulator) substrate as a multi-layered substrate 1. The multi-layered substrate 1 includes a support substrate 2 as a silicon substrate, an embedded oxide layer 3 as a $SiO_2$ layer and a silicon layer 4, which are laminated in this order. A predetermined part of the embedded oxide layer 3 in the multi-layered substrate 1 is removed so that a cavity 5 is formed. The cavity 5 extends in the horizontal direction. Further, a groove 6 is formed in the silicon layer 4 of the substrate 1. The groove 6 extends in the vertical direction of the substrate 1, and further, the groove reaches the cavity 5. The groove 6 and the cavity 5 provide a frame 7 having a square shape, a beam structure 8 and a pair of fixed electrodes 9, 10. Thus, the frame 7, the beam structure 8 and the fixed electrode portions 9, 10 are divided by the groove 6 and the cavity 5. The frame 7 is composed of a sidewall of the substrate 1.

The beam structure 8 includes a pair of anchors 11, 12, a pair of beams 13, 14, a weight portion 15, and a pair of movable electrodes 16, 17. The fixed electrode portion 9 includes a fixed anchor 9a and a fixed electrode 9b. Similarly, the fixed electrode portion 10 includes a fixed anchor 10a and a fixed electrode 10b. There is no cavity under the frame 7, the fixed anchors 9a, 10a of the fixed electrode portions 9, 10, and the anchors 11, 12 of the beam structure 8. Thus, they are fixed on the substrate 1. On the other hand, the cavity 5 is formed under the fixed electrodes 9b, 10b of the fixed electrode portions 9, 10, the beams 13, 14 of the beam structure 8, the weight portion 15 and the movable electrodes 16, 17. The weight portion 15 is connected to the anchors 11, 12 of the beam structure 8 through the beams 13, 14. Four movable electrodes 16 are protruded from one side of the weight portion 15. Further, four movable electrodes 17 are protruded from the other side of the weight portion 15. Each movable electrode 16, 17 has a comb-teeth shape, and the movable electrodes 16, 17 are parallel and disposed in the same interval. The beams 13, 14, the weight portion 15 and the movable electrodes 16, 17 provide a movable portion. The weight portion 15 with the movable electrodes 16, 17 is displaced in a movable direction parallel to the surface of the substrate 1 in accordance with acceleration as physical quantity. Specifically, the movable portion is displaceable in the X direction in FIG. 1.

Regarding the fixed electrode portion 9, four fixed electrodes 9b are protruded from one side of the anchor 9a. The fixed electrode 9b faces the one side of the movable electrode 16. Similarly, regarding the fixed electrode portion 10, four fixed electrodes 10b are protruded from one side of the anchor 10a. The fixed electrode 10b faces the one side of the movable electrode 17.

An aluminum pad 18 is formed on the surface of the anchor 9a. The fixed electrode 9b is electrically connected to an external circuit through a bonding wire bonded on the aluminum pad 18. Another aluminum pad 19 is formed on the surface of the anchor 10a. The fixed electrode 10b is electrically connected to an external circuit through a bonding wire bonded on the aluminum pad 19. Further, the third aluminum pad 20 is formed on the surface of the anchor 12 of the beam structure 8. The movable electrode 16, 17 is connected to an external circuit through a bonding wire bonded on the third aluminum pad 20.

The semiconductor acceleration sensor as a semiconductor device is formed from the multi-layered substrate 1. The movable portion is formed in the silicon layer 4, and the aluminum pads 18-20 are formed on the silicon layer 4.

The first capacitor is formed between the movable electrode 16 and the fixed electrode 9b, and the second capacitor is formed between the movable electrode 17 and the fixed electrode 10b. The distance between the movable electrode 16 and the fixed electrode 9b, and the distance between the movable electrode 17 and the fixed electrode 10b are differentially changed, so that the capacitances of the first and the second capacitors are also differentially changed. The acceleration is measured on the basis of the capacitance changes of the capacitors.

Next, the wafer having multiple semiconductor acceleration sensors is cut into individual sensors by a dicing method.

Figure 4A:
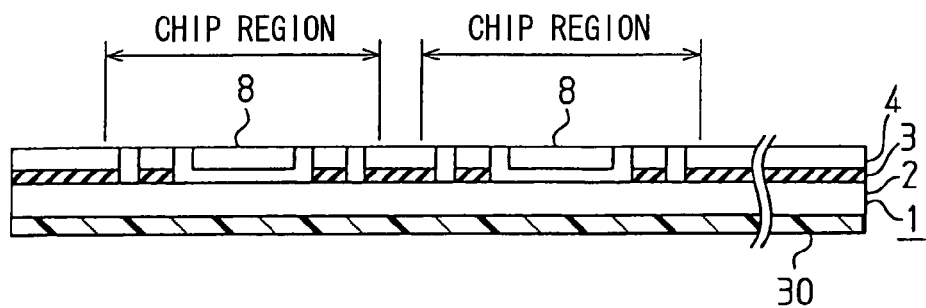
FIGS. 4A to 4C are cross sectional views explaining the positioning method of a dicing process, according to the preferred embodiment.
Figure 4B:
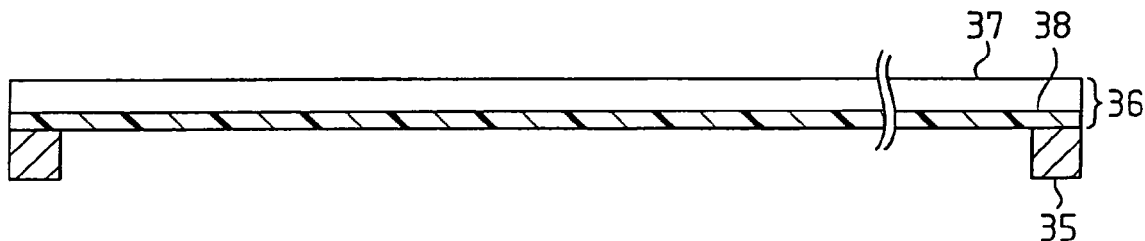
Figure 4C:
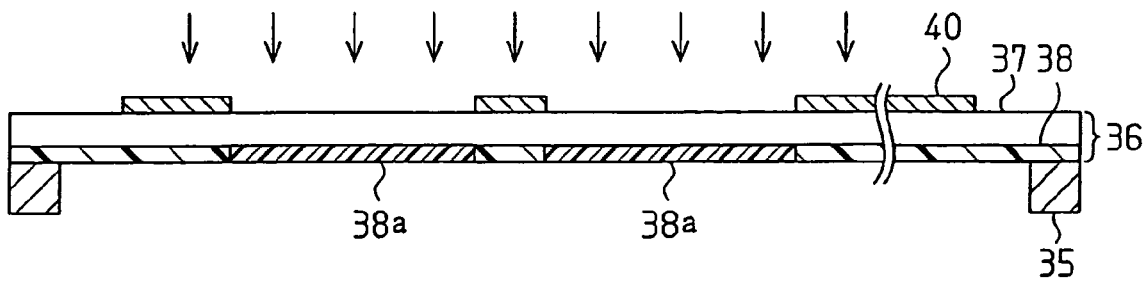

As shown in FIG. 4A, the wafer including multiple sensors is prepared. An adhesive tape 30 is applied on the support substrate 2. As shown in FIG. 4B, another adhesive tape 36 is applied on a frame 35. The adhesive tape 36 is composed of a sheet 37 and an adhesive 38. The adhesive 38 is applied on one surface of the sheet 37. The adhesive 38 is made of ultra violet curing adhesive. Further, as shown in FIG. 4C, a metallic mask 40 is disposed on the sheet 37 of the adhesive tape 36. Then, the ultra violet light is irradiated on the adhesive 38 so that a predetermined part 38a of the adhesive 38 is selectively irradiated by the light. Therefore, the adhesiveness of the predetermined part 38a of the adhesive 38 is reduced. Then, the adhesive tape 36 is mounted on a X-Y table of dicing equipment.

Figure 5A:
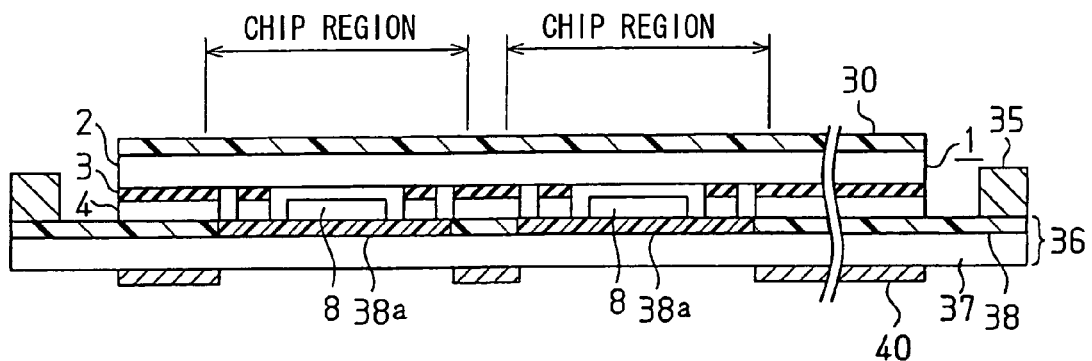
FIGS. 5A to 5C are cross sectional views explaining the positioning method of the dicing process, according to the preferred embodiment.
Figure 5B:
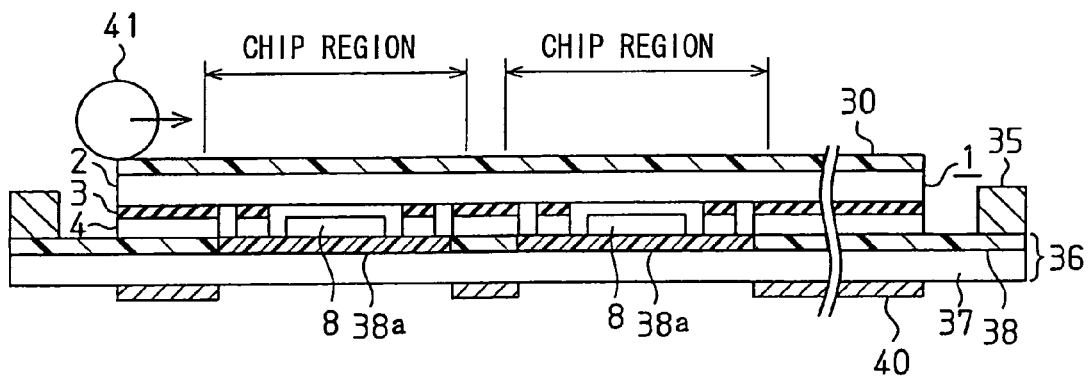

The adhesive tape 36 shown in FIG. 4C and the wafer shown in FIG. 4A are bonded in such a manner that the adhesive 38 of the adhesive tape 36 and the silicon layer 4 of the wafer are bonded, as shown in FIG. 5A. Here, the beam structure 8 is formed on the silicon layer side of the wafer. As shown in FIG. 5B, the wafer and the adhesive tape 36 are pressed by a roller 41. Here, the part 38a of the adhesive 38 in the adhesive tape 36 has weak adhesiveness, the part 38a facing the beam structure 8. Therefore, the adhesive 38 does not expand so that the adhesive 38 is prevented from penetrating into the beam structure 8. In this case, the wafer is cut from the backside of the wafer, as shown in FIG. 8. Here, the backside of the wafer is opposite to the foreside surface of the wafer. The backside is the support substrate side. The foreside surface of the wafer is the silicon layer side so that the beam structure is disposed on the foreside surface of the wafer.

Figure 5C:
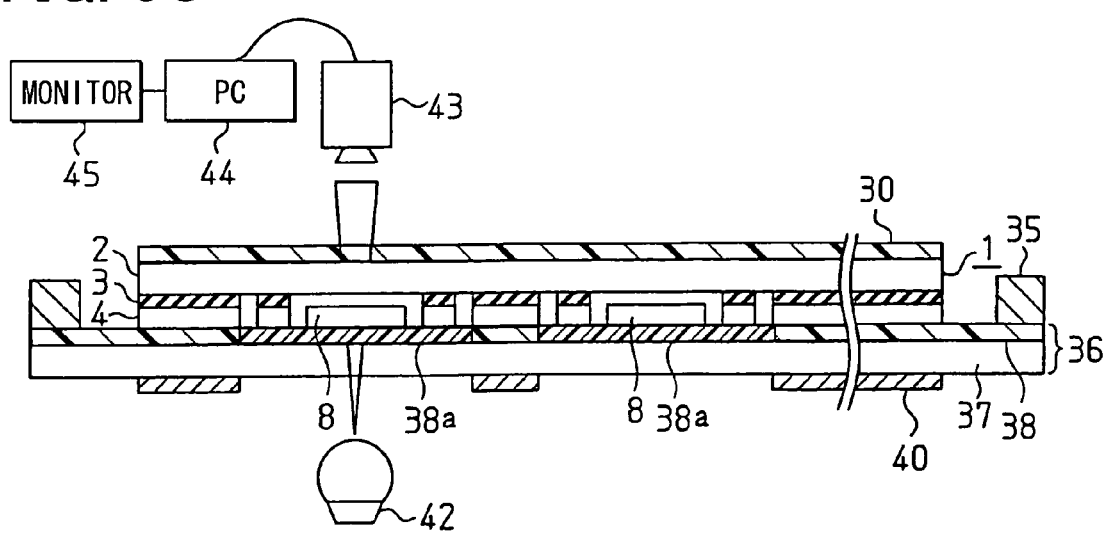

In FIG. 5C, a light source 42 is disposed on the silicon layer side of the wafer. Specifically, the light source 42 is disposed under the wafer. The light source 42 emits an infrared light. The infrared light transmits the silicon wafer. Further, a CCD (i.e., charge coupled device) camera 43 is disposed over the wafer. Specifically, the CCD camera 43 is disposed on the support substrate side of the wafer. The CCD camera 43 is electrically connected to a personal computer (i.e., PC) 44. The PC 44 is connected to a monitor 45 as a display.

Figure 6:
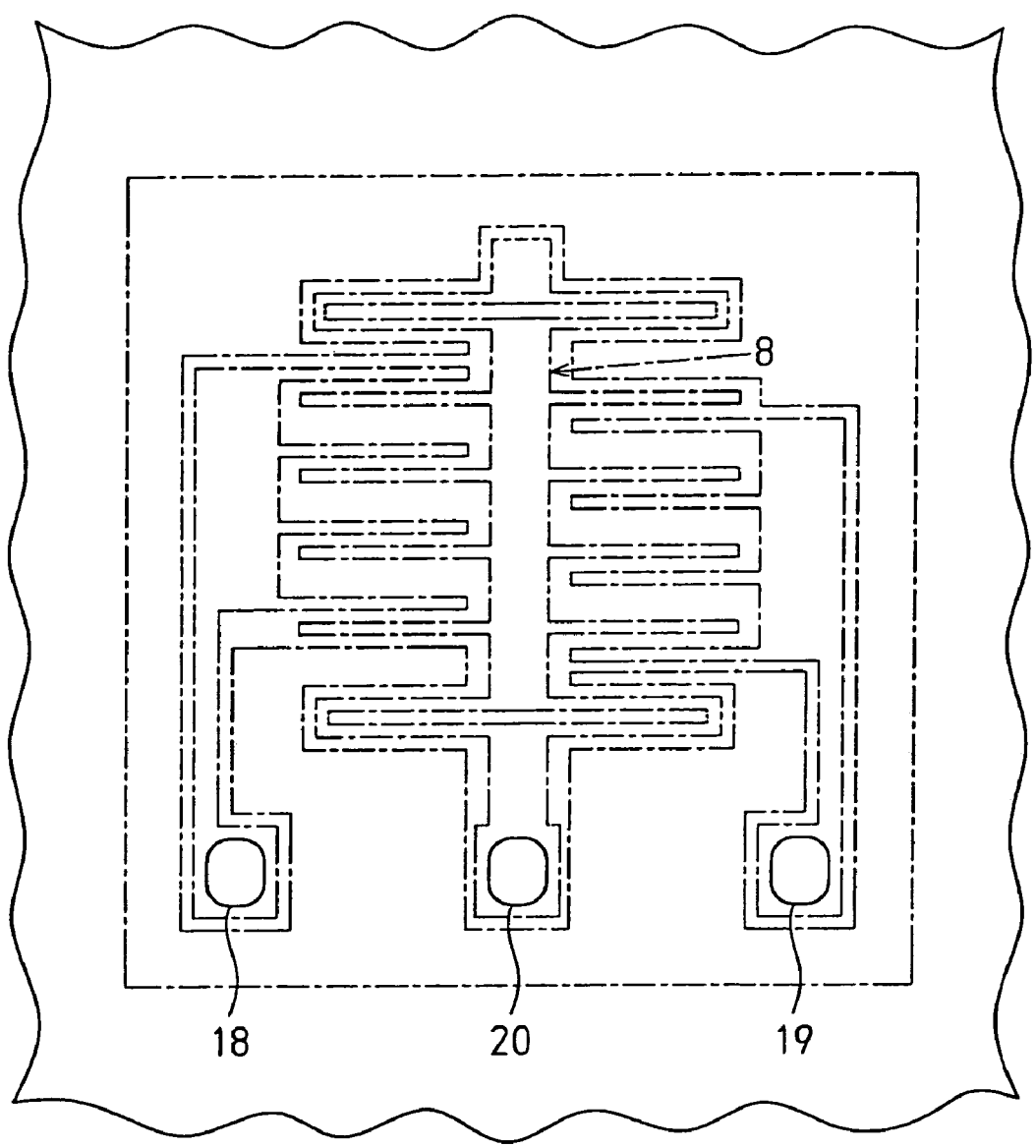
FIG. 6 is a plan view showing an image of the sensor, according to the preferred embodiment.

The positioning of the wafer is determined by using equipment shown in FIG. 5C. Specifically, the dicing line of the wafer is decided by the equipment. Firstly, the infrared light is emitted from the light source 42 so that the wafer is irradiated with the infrared light. The infrared light transmits through the wafer. Specifically, the light transmits the support substrate 2. Then, the transmitted light is detected by the CCD camera 43. Thus, the image of the wafer is obtained by the CCD camera 43. FIG. 6 shows the image of the wafer. In FIG.

Figure 7:
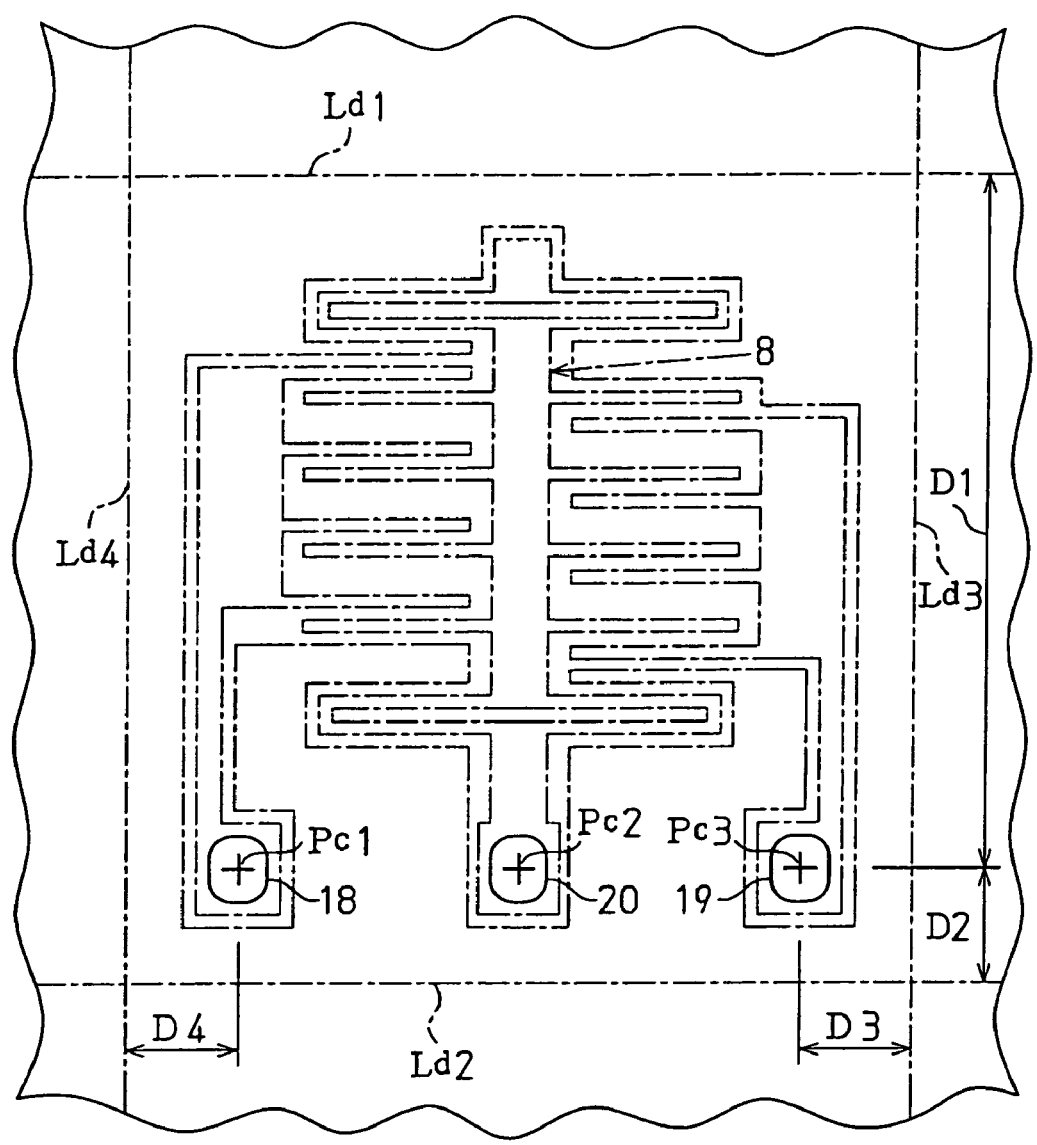
FIG. 7 is a plan view explaining image recognition of the sensor, according to the preferred embodiment.
Figure 10:
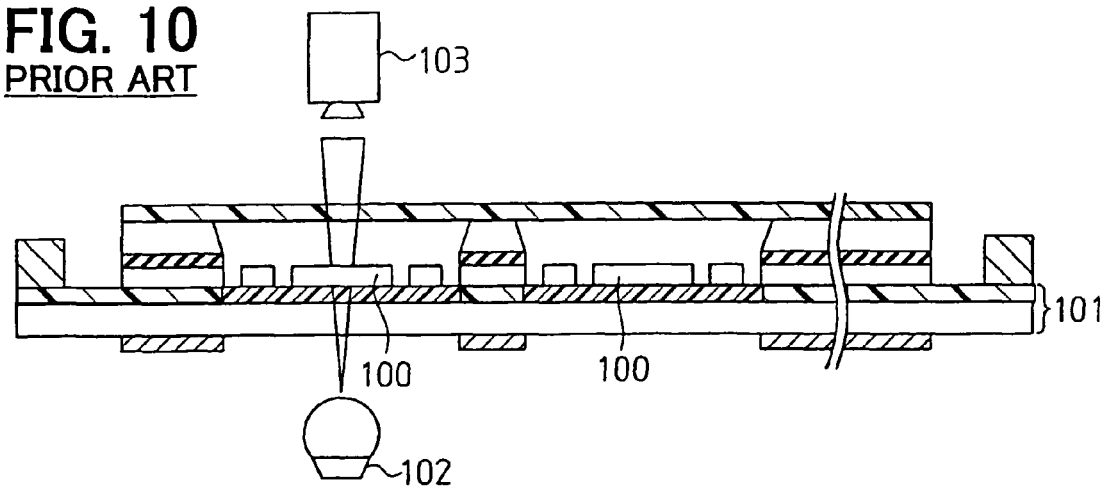
FIG. 10 is a cross sectional view explaining the positioning method of the sensor, according to the prior art.
Figure 11:
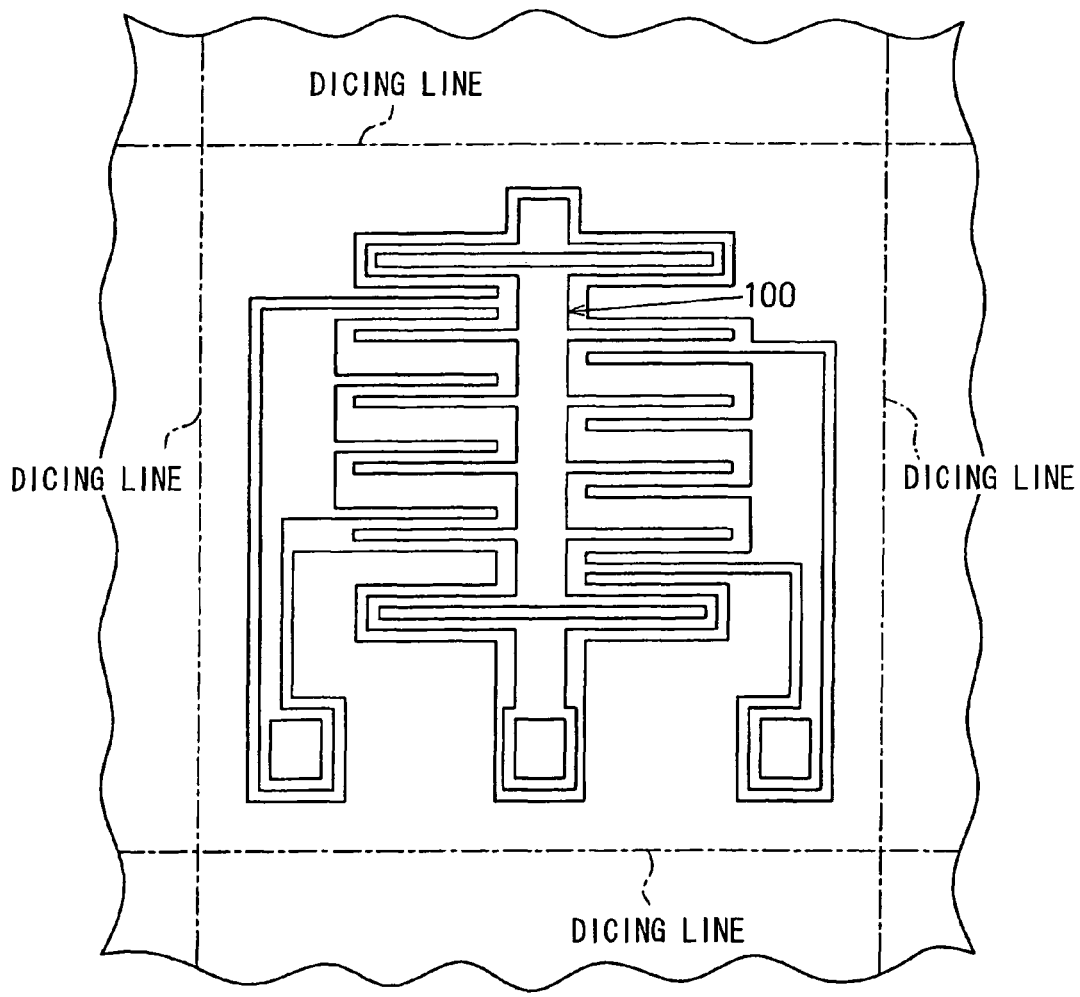
FIG. 11 is a plan view showing an image of the sensor, according to the prior art.

6, the strength of the transmitted light is weak so that the outline of the beam structure becomes broader. However, although the shapes of the aluminum pads 18-20 are not clearly defined, the outlines of the aluminum pads 18-20 are obtained. The image of the wafer is processed so that the image is recognized by the computer 44. Specifically, noise in the image is removed, and then, the image is magnified, i.e., gain of the image is increased. Further, as shown in FIG. 7, the image of the wafer is recognized on the basis of the image-processed image so that the center Pc1-Pc3 of each aluminum pad 18-20 is determined. Further, on the screen of the display in the computer 44, each dicing line Ld1-Ld4 is determined on the basis of the centers Pc1-Pc3 of the aluminum pads 18-20.

Specifically, lines between the centers Pc1-Pc3 of the aluminum pads 18-20 are drawn. On the basis of the lines, orthogonal coordinate system having two orthogonal axes is formed. In the orthogonal coordinate system, the horizontal dicing lines Ld1, Ld2 are decided. The upper horizontal dicing line Ld1 is separated from the center Pc3 of the aluminum pad 19 by the distance D1. The lower horizontal dicing line Ld2 is separated from the center Pc3 of the aluminum pad 19 by the distance D2. Similarly, the right side vertical dicing line Ld3 is decided. The right side vertical dicing line Ld3 is separated from the center Pc3 of the aluminum pad 19 by the distance D3. Further, the left side vertical dicing line Ld4 is decided. The left side vertical dicing line Ld4 is separated from the center Pc1 of the aluminum pad 19 by the distance D4. Thus, the positions of the dicing lines Ld1-Ld4 are accurately determined. Thus, the accuracy of the alignment of the wafer is improved.

Specifically, when the support substrate 8 is disposed under the beam structure 8, the wafer is cut from the backside of the wafer. Thus, the wafer is cut from the support substrate side. In this case, the light transmits the silicon wafer from the lower side of the wafer. Then, the transmitted light is detected by the CCD camera 43 so that the image of the wafer is processed. After the image is processed, the image is not clearly defined. However, the processed image is recognized by the computer 44. Thus, the centers Pc1-Pc3 of the aluminum pads 18-20 are accurately determined so that the dicing lines Ld1-Ld4 are decided.

Here, the monitor 45 as the display of the computer shows the image of the wafer. After that, a blade 60 cuts the wafer from the backside of the wafer, which is disposed on the support substrate side of the wafer. Here, the wafer is cut along with the dicing lines Ld1-Ld4. Thus, the wafer is cut into multiple chips. At this time, the beam structure 8 as the movable portion is protected with the adhesive tape 36 from cutting scraps and dicing water.

Then, whole of the surface of the adhesive 38 of the adhesive tape 36 is irradiated with ultra violet (i.e., UV) light so that the adhesiveness of the adhesive tape 36 is reduced. Thus, the adhesive tape 36 is removed from the wafer so that multiple chips are obtained.

As described above, the method for determining position of the dicing line includes: the first step of bonding the adhesive tape 36 on the silicon layer 4 in the wafer having multiple sensors formed thereon; the second step of detecting the image of the wafer with the CCD camera 43 as an imaging device, the image being obtained by inputting the transmitted light transmitted through the support substrate 2 from the light source 42 disposed on the silicon layer side of the wafer, and the CCD camera 43 being disposed on the support substrate side of the wafer; the third step of determining the dicing lines Ld1-Ld4 on the basis of the processed and recognized image of the centers Pc1-Pc3 of the aluminum pads 18-20 as a marker disposed on the silicon layer 4.

Thus, the method provides the high accuracy positioning method of the dicing line of the wafer when the wafer is cut. In the prior art, as shown in FIG. 12, the light transmitted the support substrate 110 is scattered by the surface roughness of the support substrate 110. Therefore, the shape of the beam structure is not clearly defined. Specifically, the outline of the beam structure becomes broader so that the wafer is positioned only on the basis of the edge of the beam structure. Thus, it is difficult to determine the dicing line of the wafer accurately. On the other hand, in this embodiment, the image of the wafer is processed and recognized by the computer so that the center Pc1-Pc3 of the aluminum pad 18-20 is determined by the computer 44. Therefore, the dicing line of the wafer is determined accurately on the basis of the center Pc1-Pc3 of the aluminum pads 18-20.

Further, since the aluminum pad 18-20 provides the marker, no additional process is necessitated for preparing the marker. Thus, the cost of the method for positioning the dicing line becomes lower. The aluminum pad 18-20 as a bonding pad is used for deciding the dicing line Ld1-Ld4. In this case, the center Pc1-Pc3 of the pad 18-20 having the square shape is easily and accurately determined by the computer 44.

Although the aluminum pad 18-20 is used as the marker, another marker can be used. Further, although the number of the markers 18-20 is three, other number of the markers can be used. Furthermore, although the pad has the square shape, the marker can have other shape. Further, although the markers are disposed on one side of the square sensor, the markers can be disposed on other position on the wafer. Although the pad is made of aluminum, other material can provide the marker. Although the sensor is the physical quantity sensor, other sensor can be positioned by this method. Further, although the object is the physical quantity sensor, other object can be positioned by this method.

Such changes and modifications are to be understood as being within the scope of the present invention as defined by the appended claims.

What is claimed is:

1. A method for positioning a dicing line of a semiconductor wafer having multiple semiconductor devices disposed on the wafer, wherein the wafer includes a support substrate, an embedded insulation layer and a semiconductor layer, which are stacked in this order, and wherein each semiconductor device includes a movable portion formed in the semiconductor layer of the wafer, the method comprising the steps of:

bonding an adhesive tape on the semiconductor layer of the wafer;

detecting an image of the wafer by an imaging device on the basis of a light transmitted through the wafer, wherein the light is emitted from a light source disposed on a semiconductor layer side of the wafer, and wherein the imaging device is disposed on a support substrate side of the wafer; and determining the dicing line of the wafer on the basis of a position of an image of a marker, which is disposed on the semiconductor layer of the wafer, wherein the image of the marker is obtained by image recognition from the detected image of the wafer, wherein the marker is a bonding pad made of metal, the light is an infrared light, in the step of determining the dicing line, the dicing line is determined on the basis of a center position of the bonding pad, the bonding pad includes a plurality of metal pads, the dicing line includes a plurality of dicing line segments, and the determining the dicing line includes:
- drawing a line between two center positions of the plurality of metal pads;
- defining an orthogonal coordinate system based on the line, wherein the line determines one of two orthogonal axes; and
- determining one of the plurality of dicing line segments so that the one of the dicing line segments is separated from one of the orthogonal axes by a predetermined distance.

2. The method according to claim 1, wherein the marker is used only for determining the dicing line.

3. The method according to claim 1, further comprising the steps of:
- bonding another adhesive tape on the support substrate of the wafer before the step of detecting the image of the wafer; and
- pressurizing the wafer with the adhesive tape and the other adhesive tape by a roller.

4. The method according to claim 1, wherein the imaging device is a charge coupled device camera.

5. The method according to claim 1, wherein the step of determining the dicing line includes the steps of:
- processing the image of the wafer by a computer; and
- recognizing the processed image of the wafer so that a center position of each metal pad is defined.

6. A method for positioning dicing lines of a semiconductor wafer on which multiple semiconductor devices are located, wherein the wafer includes a support substrate, an embedded insulation layer and a semiconductor layer, which are stacked in this order, and wherein each semiconductor device includes a movable portion formed in the semiconductor layer of the wafer, the method comprising:
- bonding an adhesive tape on the semiconductor layer of the wafer;
- detecting an image of the wafer by an imaging device, which senses infrared light transmitted through the wafer, wherein the light is emitted from an infrared light source located on a semiconductor layer side of the wafer, and the imaging device is located on a support substrate side of the wafer; and
- determining locations of the dicing lines of the wafer on the basis of a position of an image of at least two metal markers, which are located on the semiconductor layer of the wafer, wherein the image of the markers is obtained by the image device, in determining the locations of the dicing lines, the locations of the dicing lines are determined on the basis of the at least two markers, the determining of the positions of the dicing lines further includes:
- defining an orthogonal coordinate system based on a reference line that extends between the two markers, wherein the reference line determines positions of two orthogonal axes; and
- determining a one of the dicing lines to be a predetermined distance from a one of the orthogonal axes.

7. The method according to claim 6, further comprising providing each of the semiconductor devices on the semiconductor wafer with at least two metal markers.

8. The method according to claim 6, further comprising providing each device with a plurality of metal bonding pads, and using metal bonding pads as the metal markers.

9. The method according to claim 6, further comprising defining the reference line to extend between center positions of the two markers.

10. The method according to claim 6, wherein the one of the dicing lines is a first dicing line, and the one of the orthogonal axes is a first one of the orthogonal axes, and the method further comprises determining a second one of the dicing lines to be a predetermined distance from a second one of the orthogonal axes.

* * * * *